US009288574B2

(12) United States Patent
Pernici et al.

(10) Patent No.: US 9,288,574 B2
(45) Date of Patent: Mar. 15, 2016

(54) CIRCUIT FOR USE WITH A LOUDSPEAKER FOR PORTABLE EQUIPMENTS

(71) Applicant: ST-Ericsson SA, Plan-les-Ouates (CH)

(72) Inventors: Sergio Pernici, Bergamo (IT); Germano Nicollini, Piacenza (IT)

(73) Assignee: ST-ERICSSON SA, Plan-les-Ouates (CH)

( * ) Notice: Subject to any disclaimer, the term of this patent is extended or adjusted under 35 U.S.C. 154(b) by 39 days.

(21) Appl. No.: 14/374,929

(22) PCT Filed: Feb. 11, 2013

(86) PCT No.: PCT/EP2013/052707
§ 371 (c)(1),
(2) Date: Jul. 28, 2014

(87) PCT Pub. No.: WO2013/127620
PCT Pub. Date: Sep. 6, 2013

(65) Prior Publication Data
US 2015/0010171 A1    Jan. 8, 2015

Related U.S. Application Data

(60) Provisional application No. 61/610,061, filed on Mar. 13, 2012.

(30) Foreign Application Priority Data

Feb. 27, 2012    (EP) .................................... 12157097

(51) Int. Cl.
*H03F 99/00*    (2009.01)
*H04R 3/00*    (2006.01)
(Continued)

(52) U.S. Cl.
CPC ................ *H04R 3/00* (2013.01); *H03F 3/1855* (2013.01); *H03F 3/45183* (2013.01); *H03F 3/45511* (2013.01); *H04R 3/002* (2013.01); *H03F 2200/03* (2013.01); *H03F 2200/481* (2013.01); *H03F 2203/45374* (2013.01); *H03F 2203/45418* (2013.01)

(58) Field of Classification Search
CPC .............................. H03F 3/68; H03F 2200/03
USPC ......................................... 381/120
See application file for complete search history.

(56) References Cited

U.S. PATENT DOCUMENTS 5,206,912 A    4/1993    Noro
6,809,591 B1    10/2004    Ohashi
(Continued)

FOREIGN PATENT DOCUMENTS

JP    8-172693 A    7/1996

OTHER PUBLICATIONS

International Search Report issued in corresponding International application No. PCT/EP2013/052707, date of mailing Jun. 10, 2013.
(Continued)

*Primary Examiner* — Simon King
(74) *Attorney, Agent, or Firm* — Patent Portfolio Builders PLLC

(57) ABSTRACT

The invention relates to a circuit (100) for use with a loudspeaker (104) having a first differential input terminal (t1) and a second differential input terminal (t2), the circuit (100) comprising: a differential power amplifier (103) having a first differential output terminal (t3) operatively connected to the first differential input terminal (t1) of the loudspeaker (104) and a second differential output terminal (t4) operatively connected to the second differential input terminal (t2) of the loudspeaker (104);—a first resistor (RS1) disposed between the first differential output terminal (t3) of the differential power amplifier (103) and the first differential input terminal (t1) of the loudspeaker (104); a second resistor (RS2) disposed between the second differential output terminal (t4) of the differential power amplifier (103) and the second differential input terminal (t2) of the loudspeaker (104). The circuit (100) further comprises: a first resistive module (RR1, RR2) arranged to generate on a respective output terminal (t5) a first control voltage (VIN), the first resistive module (RR1, RR2) having a first input terminal (t6) connected to the first differential output terminal (t3) of the power amplifier (103) and a second input terminal (t7) connected to the second differential input terminal (t2) of the loudspeaker (104), a second resistive module (RR3, RR4) arranged to generate on a respective output terminal (t8) a second control voltage (VIP), the second resistive module (RR3, RR4) having a first input terminal (t9) connected to the second differential output terminal (t4) of the power amplifier (103) and a second input terminal (t10) connected to the first differential input terminal (t1) of the loudspeaker (104). The loudspeaker circuit (100) being arranged to control the differential power amplifier (103) on the basis of the first control voltage (VIN) and the second control voltage (VIP).

15 Claims, 4 Drawing Sheets

(51) Int. Cl.
*H03F 3/185* (2006.01)
*H03F 3/45* (2006.01)

(56) References Cited

U.S. PATENT DOCUMENTS

2008/0212818 A1* 9/2008 DelPapa .................. H04R 3/00
                                                    381/345
2009/0085659 A1   4/2009  Sorace et al.

OTHER PUBLICATIONS

Written Opinion of the International Searching Authority issued in corresponding International application No. PCT/EP2013/052707, date of mailing Jun. 10, 2013.

European Search Report issued in corresponding European application No. EP 12 15 7097, date of completion Jul. 12, 2012.

\* cited by examiner

CIRCUIT FOR USE WITH A LOUDSPEAKER FOR PORTABLE EQUIPMENTS

TECHNICAL FIELD

The present invention relates to portable equipments and particularly to a circuit for use with a loudspeaker for portable equipments.

BACKGROUND ART

The manufacturers of portable equipments (e.g. mobile phones) need to evaluate the loudspeaker membrane displacement frequency response to offer an optimum compensation for its peaking which is the cause of the loudspeaker damage.

The peaking of the loudspeaker membrane displacement is isochronous with the peaking that can be observed in the electrical impedance transfer function of the loudspeaker, so the limiting of the peaking of the loudspeaker membrane displacement can be determined from the electrical impedance response of the loudspeaker.

Therefore, there is a need to monitor a parameter characterizing the electrical impedance transfer function of the loudspeaker in order to limit peaking of the loudspeaker membrane.

A characterization of the electrical impedance transfer function of the loudspeaker can be done during the mobile phone production stage applying a specific pattern to the loudspeaker but, for optimum limiting the peaking of the loudspeaker membrane, the electrical impedance transfer function should be done in real time during the normal listening, to track also the variation of the electrical impedance transfer function of the loudspeaker with the temperature.

In this scenario, loudspeaker architectures are known in the prior art which monitor the current passing into the loudspeaker to characterize the electrical impedance transfer function of a loudspeaker.

A typical loudspeaker architecture comprises a driving circuit arranged to drive a power amplifier of a loudspeaker.

A current detection module is disposed between the power amplifier and the loudspeaker to create a replica of such current to be sent to the driving circuit of the power amplifier. The driving circuit is arranged to estimate the electrical impedance transfer function of the loudspeaker on the basis of the replica of such current and to establish a proper equalization to apply to an audio stimulus in order to limit the current peaking and then the abnormal loudspeaker membrane displacement.

Creating a replica substantially correspondent to the current passing in the loudspeaker is very important in order to drive the power amplifier at the best in order to limit the peaking of the loudspeaker membrane reducing the risk of the damage of the loudspeaker, also during the normal listening.

SUMMARY OF THE INVENTION

An object of the present invention is to provide a improved circuit to be used with a loudspeaker for portable equipments which results more precise and reliable then the architecture of the prior art and particularly which creates a replica of the current of the loudspeaker substantially corresponding to the current passing in the loudspeaker.

According to the invention, a circuit for use with a loudspeaker having a first differential input terminal and a second differential input terminal comprises: a differential power amplifier operatively connected to the loudspeaker, the differential power amplifier having a first differential output terminal operatively connected to the first differential input terminal of the loudspeaker and a second differential output terminal operatively connected to the second differential input terminal of the loudspeaker; a first resistor disposed between the first differential output terminal of the differential power amplifier and the first differential input terminal of the loudspeaker; a second resistor disposed between the second differential output terminal of the differential power amplifier and the second differential input terminal of the loudspeaker. The circuit further comprises: a first resistive module arranged to generate on a respective output terminal a first control voltage, the first resistive module having a first input terminal connected to the first differential output terminal of the power amplifier and a second input terminal connected to the second differential input terminal of the loudspeaker; a second resistive module arranged to generate on a respective output terminal a second control voltage, the second resistive module having a first input terminal connected to the second differential output terminal of the power amplifier and a second input terminal connected to the first differential input terminal of the loudspeaker. The circuit is arranged to control the differential power amplifier on the basis of the first control voltage and the second control voltage.

A further embodiment of the invention is a portable equipment comprising a loudspeaker and a circuit for use with a loudspeaker according to the invention.

BRIEF DESCRIPTION OF THE DRAWINGS

The characteristics and the advantages of the present circuit for use with a loudspeaker will be better understood from the following detailed description of one embodiment thereof, which is given by way of illustrative and non-limiting example with reference to the annexed drawings, in which.

DETAILED DESCRIPTION OF PREFERRED EMBODIMENTS

Figure 1:
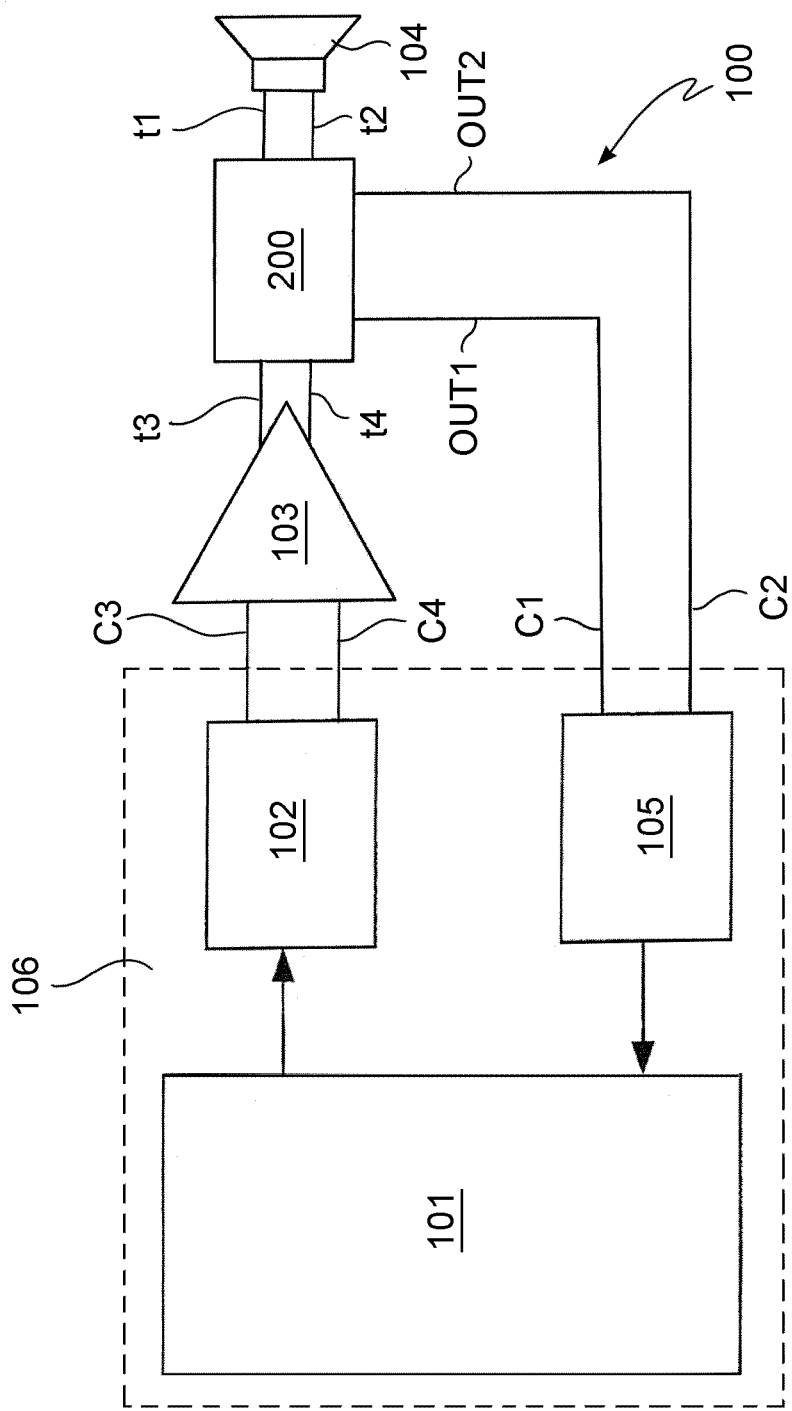
FIG. 1 shows a block diagram of the circuit of the invention.

With reference to the block diagram of FIG. 1, a circuit 100 for use with a loudspeaker 104 for portable equipments can be described.

The circuit of the invention can be used in any portable equipment in which there is audio signal which can be listened by a user through a loudspeaker, e.g. mobile phones, MP3 players, PDAs (Personal Digital Assistant), portable computers and so on.

The circuit 100 comprises a driving module 106, a power operational amplifier 103 and an operative module 200. In order to better describe the circuit 100 of the invention, a loudspeaker 104 is also illustrated in the FIGS. 1 and 2.

The operative module 200 is symbolically reported in FIG. 1 replacing circuital elements of the invention which will be described in the following, with also the power operational amplifier 103 and the loudspeaker 104, with reference to FIG. 2.

With reference again to the circuit 100 of FIG. 1, the driving module 106 has a first differential input terminal c1 operatively connected with a first differential output terminal OUT1 of the differential stage (described in detail in the following with reference to FIGS. 3 and 4) included in the operative module 200 and a second differential input terminal c2 operatively connected to the second differential output terminal OUT2 of the above indicated differential stage.

In addition, the driving circuit 106 has a first differential output terminal c3 operatively connected to a first differential input terminal of the differential power amplifier 103 and a second differential output terminal c4 operatively connected to a second differential input terminal of the differential power amplifier 103.

In greater detail, the driving module 106 comprises a digital processing unit 101, a digital-to-analog converter (DAC) 102 and an analog-to-digital (ADC) converter 105.

The AD converter 105 has differential input terminals corresponding to the first differential input terminal c1 and the second differential input terminal c2, respectively, of the driving circuit.

The DA converter 102 has differential output terminals corresponding to the first differential output terminal c3 and the second output terminal c4 of the driving module 106.

The AD converter 105 is arranged to convert an analog operative signal received from the operative module 200 into a digital operative signal to be provided to the digital processing unit 101.

The digital processing unit 101 is arranged to provide to the DA converter 102 an audio digital signal (i.e. an audio digital bit stream) representing a driving signal to be provided to the power operational amplifier 103. The digital processing unit 101 is arranged to generate said digital driving signal on the basis of said digital operative signal.

The DA converter 102 is arranged to convert the audio digital signal received from the digital processing unit 101 into an analog driving signal to be provided to the operational amplifier 106.

Figure 2:
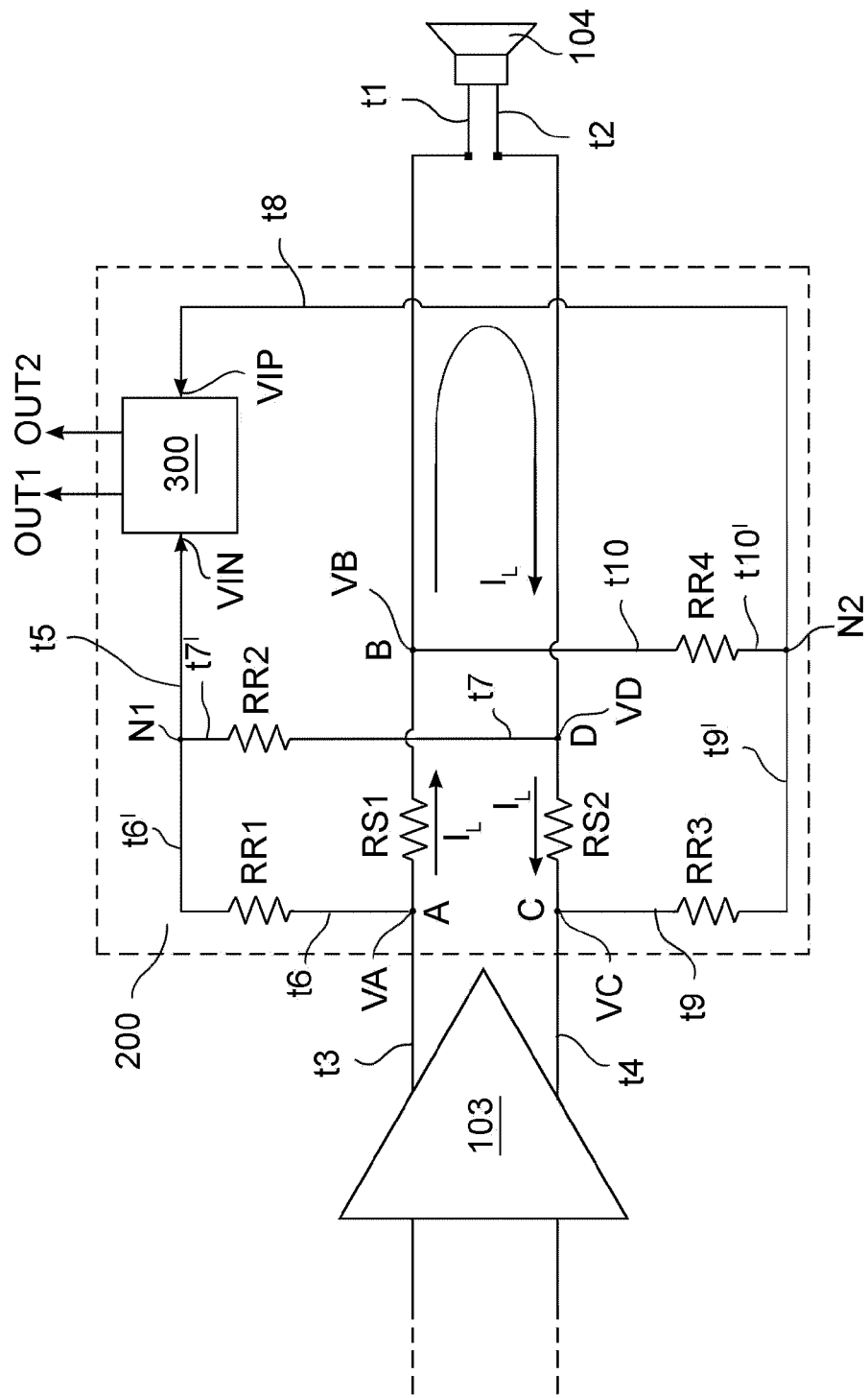
FIG. 2 shows, from a circuital point of view, a portion of circuit of FIG. 1.
Figure 3:
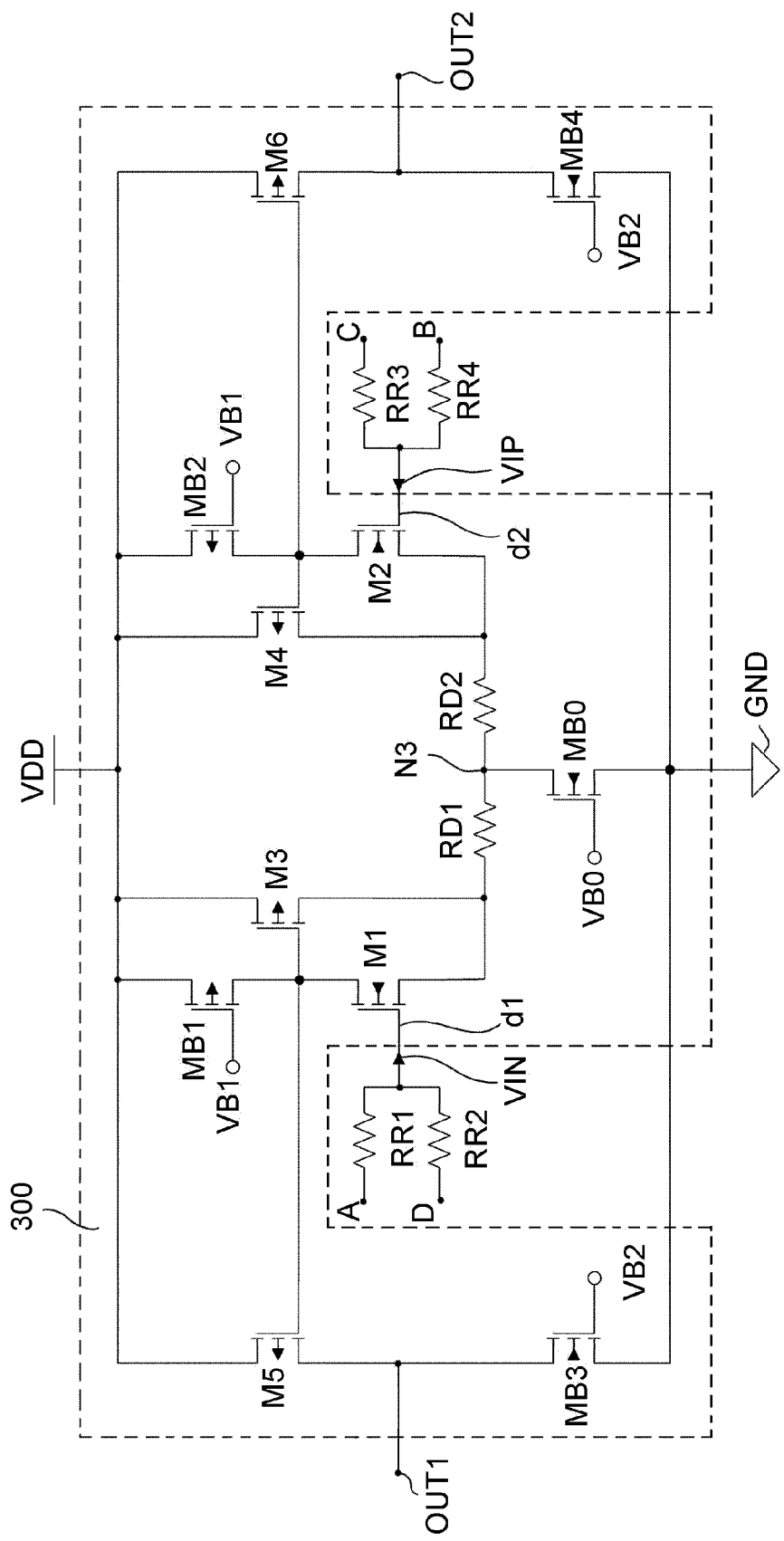
FIG. 3 shows a circuit diagram of an embodiment of a differential stage employed in the circuit of the invention.
Figure 4:
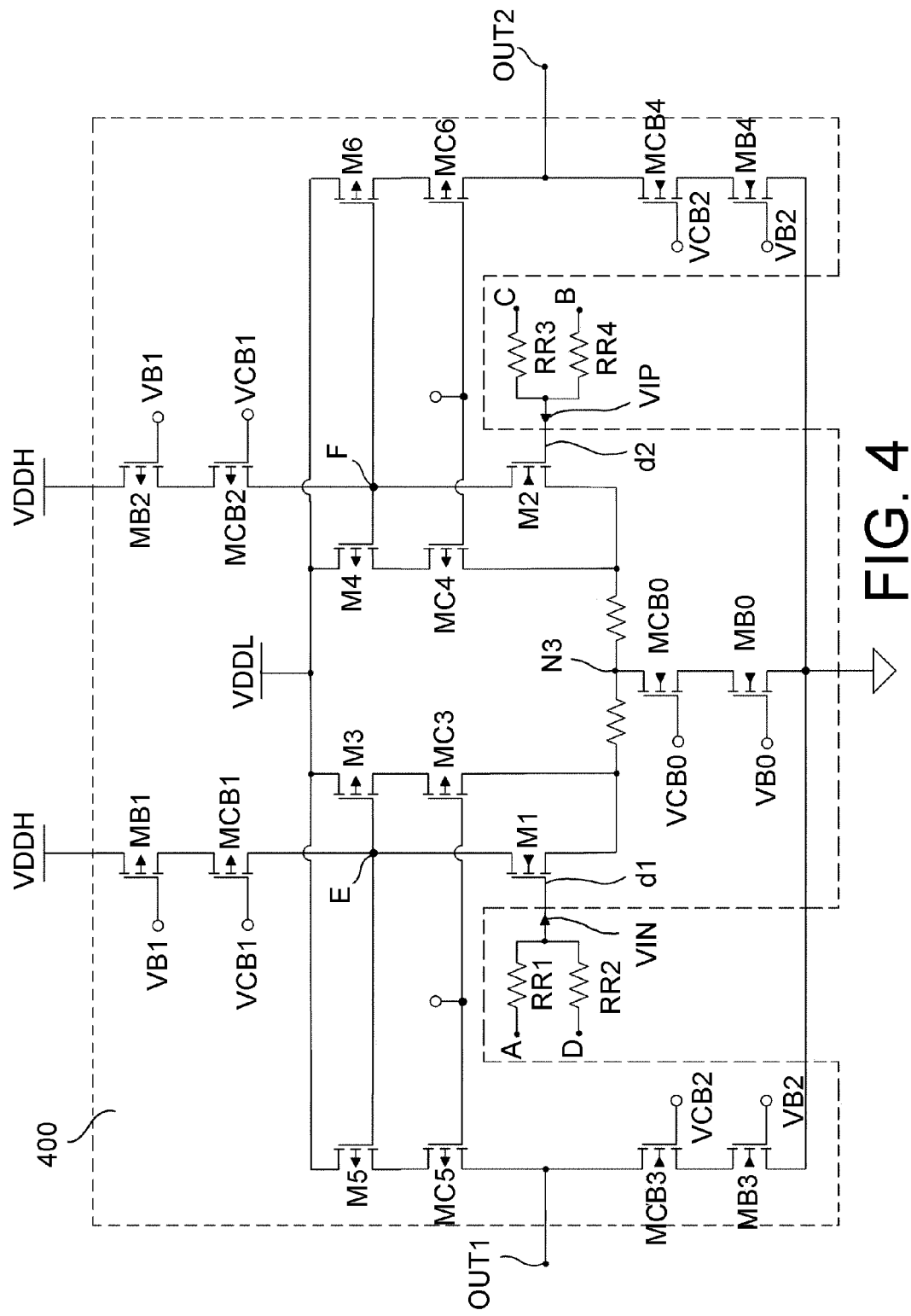
FIG. 4 shows a circuit diagram of a further embodiment of a differential stage employed in the circuit of the invention.

With reference now to FIGS. 2-4, circuit diagrams of preferred embodiments of the circuit 100 of the invention are now described.

As previously indicated, the invention relates to a circuit 100 for use with the loudspeaker 104, already mentioned with reference to FIG. 1, having a first differential input terminal t1 and a second differential input terminal t2.

By loudspeaker it is meant any audio transducer and therefore it comprises also ear-speakers or headphones which can be connected to a portable equipment in addition to the loudspeaker of the portable equipment itself.

The circuit 100 comprises a differential power amplifier 103, already mentioned with reference to FIG. 1, operatively connected to the loudspeaker 104. The differential power amplifier 103 has a first differential output terminal t3 operatively connected to the first differential input terminal t1 of the loudspeaker 104 and a second differential output terminal t4 operatively connected to the second differential input terminal t2 of the loudspeaker 104.

In addition, the circuit 100 comprises a first resistor RS1 disposed between the first differential output terminal t3 of the differential power amplifier 103 and the first differential input terminal t1 of the loudspeaker 104.

Furthermore, the circuit 100 further comprises a second resistor RS2 disposed between the second differential output terminal t4 of the differential power amplifier 103 and the second differential input terminal t2 of the loudspeaker 104.

It should be noted that the first resistor RS1 and the second resistor RS2 are preferably internal to the chip on which the circuit 100 is made and their type depends on the process characteristics of the chip itself, e.g. poly, metal, diffusion and so on.

The circuit 100 further comprises a first resistive module RR1, RR2 arranged to generate on a output terminal t5 a first control voltage VIN. The first resistive module RR1, RR2 has a first input terminal t6 connected to the first differential output terminal t3 of the power amplifier 103 and a second input terminal t7 connected to the second differential input terminal t2 of the loudspeaker 104.

In addition, the circuit 100 further comprises a second resistive module RR3, RR4 arranged to generate on a output terminal t8 a second control voltage VIP. The second resistive module RR3, RR4 has a first input terminal t9 connected to the second differential output terminal t4 of the power amplifier 103 and a second input terminal t10 connected to the first differential input terminal t1 of the loudspeaker.

As it will be also described in detail in the following, the circuit 100 is arranged to control the differential power amplifier 103 on the basis of the first control voltage VIN and the second control voltage VIP.

In greater detail, the first resistive module RR1, RR2 comprises a third resistor RR1 and a fourth resistor RR2. The third resistor RR1 has a respective first terminal corresponding to the first input terminal t6 of the first resistive module RR1, RR2 and a respective second terminal t6'. The fourth resistor RR2 has a respective first terminal corresponding to the second input terminal t7 of the first resistive module RR1, RR2 and a respective second terminal t7'. The second terminal t6' of the third resistor RR1 and the second terminal t7' of the fourth resistor RR2 are connected together in a node N1. The output terminal t5 of the first resistive module RR1, RR2 is connected to the node N1.

The second resistive module RR3, RR4 comprises a fifth resistor RR3 and a sixth resistor RR4. The fifth resistor RR3 has a respective first terminal corresponding to the first input terminal t9 of the second resistive module RR3, RR4 and a respective second terminal t9'. The sixth resistor RR4 has a first terminal corresponding to the second input terminal t10 of the second resistive module RR3, RR4 and a second terminal t10'. The second terminal t9' of the fifth resistor RR3 and the second terminal t10' of the sixth resistor RR4 are connected together in a node N2. The output terminal t8 of the second resistive module RR3, RR4 is connected to the node N2.

With reference to the value of the resistors of the circuit diagram reported in the FIG. 2, it should be considered that the value of such resistors is advantageously defined to obtain a specific operation of the circuit 100, as it will be clearly explained in the following with the description of the operation of the circuit itself.

In particular, the third resistor RR1, the fourth resistor RR2 (both included in the first resistive module RR1, RR2), the fifth resistor RR3, the sixth resistor RR4 (both included in the second resistive module RR3, RR4) have substantially the same first reference value.

In addition, the first resistor RS1 and the second resistor RS2 have substantially the same second reference value.

According to further embodiments of the invention, it should be noted that the first resistive module and the second resistive module can be made up of other combinations of resistors having the same effect as the first resistive module RR1, RR2 and the second resistive module RR3, RR4 described with reference to the embodiment of FIG. 2.

It should be noted that the second reference value is advantageously lower than the first reference value. In fact, as an example, the first reference value can be comprised in the range of 1-20 kΩ while the second reference value can be comprised in the range of 50-200 mΩ.

It should be also noted that the second reference value is advantageously so small in order to obtain a small voltage gain loss in the loudspeaker 104 which can be easily compensated increasing the gain of the differential power amplifier 103.

Relating again to FIG. 2, the circuit 100 further comprises a differential stage 300, simply illustrated as a diagram block, which will be described in detail with reference to FIGS. 3 and 4.

As schematically represented in FIG. 2, the differential stage 300 has a first differential input terminal operatively connected to the output terminal t5 of the first resistive module RR1, RR2 to receive the first control voltage VIN and a second differential input terminal operatively connected to the output terminal t8 of the second resistive module RR3, RR4 to receive the second control voltage VIP. The differential stage 300, as illustrated in FIG. 2, has further a first differential output terminal OUT1 and a second differential output terminal OUT2 to be connected to the driving circuit 106 of the differential power amplifier 103, as previously described with reference to the block diagram of FIG. 1.

It should be observed that the first resistor RS1, the second resistor RS2, the first resistive module RR1, RR2, the second resistive module RR3, RR4 and the differential stage 300 are represented in FIG. 2 as included in a box (represented with dotted line) representing the operative module 200 schematically previously introduced with reference to the block diagram of FIG. 1.

With reference now to the circuital diagram of FIG. 3, a differential stage 300, according to a first embodiment, is described.

The differential stage 300 of FIG. 3 comprises a first differential input terminal d1 arranged to receive the first control voltage VIN and a second differential input terminal d2 arranged to receive the second control voltage VIP. Furthermore, the differential stage 300 of FIG. 3 comprises a first differential output terminal OUT1 and a second differential output terminal OUT2.

In greater detail, the differential stage 300 comprises a first input NMOS transistor M1 having the respective gate terminal corresponding to the first differential input terminal d1 of the differential stage 300, the respective drain terminal operatively connected to a first reference voltage VDD through a first current generator MB1 and the source terminal operatively connected to a second supply voltage GND through a first source resistor RD1 of the differential stage 300 and a second current generator MB0.

Furthermore, the differential stage 300 comprises a second input NMOS transistor M2 having the respective gate terminal corresponding to the second differential input terminal d2 of the differential stage 300, the respective drain terminal operatively connected to the first reference voltage VDD through a third current generator MB2 and the respective source terminal operatively connected to the second reference voltage GND through a second source resistor RD2 of the differential stage 300 and the second current generator MB0.

The first reference voltage is for example the power supply as provided by the battery of a portable equipment in which the circuit 100 is included. An example of values of the first reference voltage is 3.2-4.8 V. The second reference voltage is for example the ground (i.e. 0V).

The first current generator MB1 is for example a PMOS transistor having the respective gate terminal connected to a first bias voltage VB1, the respective source terminal connected to the first reference voltage VDD and the respective drain terminal connected to the source terminal of the first input NMOS transistor M1 of the differential stage 300.

In the same way, the third current generator MB2 is for example a PMOS transistor having the respective gate terminal connected to the first bias voltage VB1 the respective source terminal connected to the first reference voltage VDD and the respective drain terminal connected to the source terminal of the second input NMOS transistor M2 of the differential stage 300.

The first source resistor RD1 has a respective first terminal connected to the source terminal of the first input NMOS transistor M1 of the differential stage 300 and a respective second terminal.

The second source resistor RD2 has a respective first terminal connected to the source terminal of the second input NMOS transistor M2 of the differential stage 300 and a respective second terminal.

The second terminal of the first source resistor RD1 and the second terminal of the second source resistor RD2 are connected together in a node N3.

The second current generation MB0 is for example a NMOS transistor having the respective gate terminal connected to a second bias voltage VB0, the respective drain terminal connected to the node N3 and the respective source terminal connected to the second reference voltage GND.

With reference to the first bias voltage VB1 and the second bias voltage VB0, it should be noted that such bias voltages should be set to an appropriate value in order to have a current in the second current generator MB0 higher than the sum of the currents in the first current generator MB1 and the third current generator MB2. The difference between the current in the second current generator MB0 and the sum of the currents in the first current generator MB1 and the third current generator MB2 is equal to the sum of the currents in the first PMOS transistor M3 of the first current mirror M3, M5, MB3 and the first PMOS transistor M4 of the second current mirror M4, M6, MB4.

As an example, the second bias voltage VB0 can be set to have a current of 200 μA in the second current generator MB0 while the first bias voltage VB1 can be set to have a current of 50 μA in the first current generator MB1 and in the third current generator MB2. In such a way, the resulting current in both the first PMOS transistor M3 of the first current mirror M3, M5, MB3 and the first PMOS transistor M4 of the second current mirror M4, M6, MB4 will be 50 μA.

The first source resistor RD1 and the second source resistor RD2 have substantially the same value, e.g. 100-400 Ω.

With reference again to the FIG. 3, the differential stage 300 further comprises a first current mirror M3, M5, MB3 arranged to mirror the current passing on the first source resistor RD1 of the differential stage 300 to a first output branch M5, MB3 connected to the first differential output terminal OUT1 of the differential stage 300.

In the same way, the differential stage 300 further comprises a second current mirror M4, M6, MB4 arranged to mirror the current passing on the second source resistor RD2 of the differential stage 300 to a second output branch M6, MB4 connected to the second differential output terminal OUT2 of the differential stage 300.

In greater detail, the first current mirror M3, M5, MB3 comprises a respective first PMOS transistor M3 having the respective gate terminal connected to the drain terminal of the first input NMOS transistor M1 of the differential stage 300, the respective source terminal connected to the first reference voltage VDD and the respective drain terminal connected to the source terminal of the first input NMOS transistor M1 of the differential stage 300.

Furthermore, the first output branch M5, MB3 of the first current mirror M3, M5, MB3 comprises a respective second PMOS transistor M5 having the gate terminal connected to the drain terminal of the first input NMOS transistor M1 of the differential stage 300, the respective source terminal connected to the first reference voltage VDD and the respective drain terminal connected to the second reference voltage GND through a respective current generator MB3.

The first differential output terminal OUT1 of the differential stage 300, 400 corresponds to the drain terminal of the second PMOS transistor M5 of the first output branch M5, MB3.

The current generator MB3 of the first output branch M5, MB3 is a NMOS transistor MB3 having the respective gate terminal connected to a third bias voltage VB2, the respective drain terminal connected to the drain terminal of the second PMOS transistor M5 of the first output branch M5, MB3 and the respective source terminal connected to the second reference voltage GND.

The second current mirror M4, M6, MB4 comprises a respective first PMOS transistor M4 having the respective gate terminal connected to the drain terminal of the second input NMOS transistor M2 of the differential stage 300, the respective source terminal connected to the first reference voltage VDD and the respective drain terminal connected to the source terminal of the second input NMOS transistor M2 of the differential stage 300.

Furthermore, the second output branch M6, MB4 of the second current mirror M4, M6, MB4 comprises a respective second PMOS transistor M6 having the gate terminal connected to the drain terminal of the second input NMOS transistor M2 of the differential stage 300, the respective source terminal connected to the first reference voltage VDD and the respective drain terminal connected to the second reference voltage GND through a respective current generator MB4.

It should be noted that the second differential output terminal OUT2 of the differential stage 300 corresponds to the drain terminal of the second PMOS transistor M6 of the second output branch M6, MB4.

The current generator MB4 of the second output branch M6, MB4 is a NMOS transistor MB4 having the respective gate terminal connected to the third bias voltage VB2, the respective drain terminal connected to the drain terminal of the second PMOS transistor M6 and the respective source terminal connected to the second reference potential GND.

It should noted that the first PMOS transistor M3 of the first current mirror M3, M5, MB3 and the first PMOS transistor M4 of the second current mirror M4, M6, MB4 are arranged to represent a feedback loop around the first input NMOS transistor M1 and the second input NMOS transistor M2, respectively. In addition, the first PMOS transistor M3 of the first current mirror M3, M5, MB3 and the first PMOS transistor M4 of the second current mirror M4, M6, MB4 may for instance have the same size of the transistor representing the first current generator MB1 and the third current generator MB2, respectively. Therefore, each of the above indicated transistors MB1, M3, M4, MB2 can be arranged to carry a quarter of the bias current generated by the second current generator MB0.

With reference now to the circuital diagram of FIG. 4, a differential stage 400, according to a second embodiment, is described.

The differential stage 400 of FIG. 4 is substantially analogous to the one described with reference to the circuit diagram of FIG. 3.

For this reason the same elements illustrated in both the circuit diagram of FIG. 3 and the circuit diagram of FIG. 4 are indicated with the same alphanumerical reference.

The description of the circuit diagram of FIG. 3 can be repeated for illustrating the circuit diagram of FIG. 4. However, for sake of brevity, only the differences of the differential stage 400 with respect to the differential stage 300 are now described.

In particular, each of the NMOS transistors MB0, MB3 and MB4 and each of the PMOS transistors MB1 and MB2, representing the current generators of the differential stage, is electrically connected in series with a respective NMOS transistor MCB0, MCB3, MCB4 and with a PMOS transistor MCB1, MCB2, respectively, in a cascode configuration.

In the same way, each of the PMOS transistor M3, M5 of the first current mirror M3, M5, MB3 is electrically connected in series with a respective PMOS transistor MC3, MC5 in a cascode configuration and each of the PMOS transistor M4, M6 of the second current mirror M4, M6, MB4 is electrically connected in series with a respective PMOS transistor MC4, MC6 in a cascode configuration.

In addition, it should noted that the differential stage 400 of FIG. 4, rather a single first reference voltage VDD, as the differential stage 300 of FIG. 3, comprises a first level of the first reference voltage VDDH and a second level of the first reference voltage VDDL.

The first current generator MB1 of the differential stage 400, in the cascode configuration, is arranged to connect the drain terminal of the first input NMOS transistor M1 to the first level of the first reference voltage VDDH. In a corresponding way, the third current generator MB2 of the differential stage 400, in the cascode configuration, is arranged to connect the drain terminal of the second input NMOS transistor M2 to the first level of the first reference voltage.

Each of the drain terminals of the first PMOS transistor M3 and the second PMOS transistor M5 of the first current mirror M3, MC3, M5, MC5, MB3, MCB3 is connected to the second level of the first reference voltage VDDL. In a corresponding way, each of the drain terminals of the first PMOS transistor M4 and the second PMOS transistor M6 of the second current mirror M4, MC4, M6, MC6, MB4, MCB4 is connected to the second level of the first reference voltage VDDL.

The first level of the first reference voltage VDDH is higher than the second level of the first reference voltage VDDL. As an example, the first level of the first reference voltage VDDH corresponds to the power supply of the differential power amplifier 103, e.g. 3.2 V, while the second level of the first reference voltage VDDL corresponds to a power supply of an analog signal processor, e.g. 1.5 V.

With respect to the differential stage 300 of the FIG. 3, the differential stage 400 of the FIG. 4 has an improved current mirroring of the biasing current of second current generator MB0. This advantageously allows to obtain an increase precision of the value of the current signal in each branch of the circuit diagram of FIG. 4, in front of process/temperature/supply voltage variations of the circuit 100.

With reference now to the circuit diagram of FIG. 2 and FIG. 3, an example of operation of the circuit 100 of the invention, to be used for the loudspeaker 104, is now described.

In audio listening condition, a current signal $I_L$ (indicated by a respective arrow in FIG. 2) passes from the differential power amplifier 103 to the loudspeaker 104 through the first resistor RS1 and from the loudspeaker 104 to the differential power amplifier 103 through the second resistor RS2.

The voltage drop dV on the first resistor RS1 and the second resistor RS2, due to the current signal $I_L$, are used by the first resistive module RR1, RR2 to generate the first control voltage VIN and by the second module RR3, RR4 to generate the second control voltage VIP.

In fact, taking into account that the first reference value of the resistors RR1, RR2, RR3, RR4 is higher than the second reference value of the first resistor RS1 and the second resistor RS2, and also considering the differential structure of FIG. 2, it can be written as follows:

$$VA=VCM-V$$

$$VB=VCM-V+dV$$

$$VC=VCM+V$$

$$VD=VCM+V-dV$$

wherein

VCM is the common mode output voltage of the differential power amplifier 103, and V is the voltage signal amplitude.

In view of the above, it can be also written:

$$VIP=(VB+VC)/2=VCM+(dV/2)=VCM+(RS1 \cdot I)/2$$

$$VIN=(VA+VD)/2=VCM-(dV/2)=VCM-(RS2 \cdot I)/2$$

With reference now to FIG. 3, the first reference voltage VIN and the second reference voltage VIP are provided on the first input differential terminal d1 and the second input differential terminal d2, respectively, of the differential stage 300.

In particular, the voltage drop dV on the first resistor RS1 and the second resistor RS2 are provided, in differential way, at the gate terminal of the first input NMOS transistor M1 and the gate terminal of the second input NMOS transistor M2, respectively.

In this way, a symmetrical unbalance of the first input NMOS transistor M1 and the second input NMOS transistor M2 and a respective current signal flowing in the first source resistor RD1 and the second source resistor RD2, respectively, is present.

Thanks to the feedback loop introduced by the first PMOS transistor M3 of the first current mirror M3, M5, MB3 and the first PMOS transistor M4 of the second current mirror M4, M6, MB4 around the first input NMOS transistor M1 and the second input NMOS transistor M2, respectively, almost the current signal present on the first source resistor RD1 is drawn by the first PMOS transistor M3 of the first current mirror M3, M5, MB3 and the current signal present on the second source resistor RD2 is drawn by the first PMOS transistor M4 of the second current mirror M4, M6, MB4.

On the contrary, the portions of the current signal drawn by the first input NMOS transistor M1 and the second input NMOS transistor M2, respectively, are negligible and equal to the amount needed to unbalance the gate terminals of the first PMOS transistor M3 of the first current mirror M3, M5, MB3 and the first PMOS transistor M4 of the second current mirror M4, M6, MB4 to advantageously allow them to draw the current signal present on the first source resistor RD1 and the second source resistor RD2, respectively.

In addition, since the gate terminals of the first PMOS transistor M3 of the first current mirror M3, M5, MB3 and the first PMOS transistor M4 of the second current mirror M4, M6, MB4 are high impedance points, the current signal unbalance in the first input NMOS transistor M1 and the second input NMOS transistor M2 is negligible.

In view of this, there is no significant voltage drop between the gate and the source of both the first input NMOS transistor M1 and the second input NMOS transistor M2 due to their respective transconductance which appears to be in series with the first source resistor RD1 and the second source resistor RD2, respectively.

Therefore, each of the first input NMOS transistor M1 and the second input NMOS transistor M2 acts as an almost ideal voltage follower, driving the first source resistor RD1 and the second source resistor RD2, respectively, with a respective control voltage which follows the first control voltage VIN and the second control voltage VIP, respectively, advantageously resulting in a precise, process independent, voltage copier.

It should noted that in the case the first source resistor RD1 and the second source resistor RD2 are made with the same type of resistors as the first resistor RS1 and the second resistor RS2, a precise ratio can be obtained between the current signal present in the first resistor RS1 and the second resistor RS2 and the current signal present in the first source resistor RD1 and the second source resistor RD2 equal to the ratio of the first resistor RS1 and the first source resistor RD1 and to the ratio of the second resistor RS2 and the second source resistor RD2. In addition, this ratio is temperature independent since the above indicated resistors (RS1, RD1, RS2, RD2) are of the same type and so their values track in temperature. The only precaution to be taken is to have a good enough layout matching between such resistors in term of both design shape and proximity.

The signal current passing in the first source resistor RD1, passing also in the first PMOS transistor M3 of the first current mirror M3, M5, MB3, and the signal current passing in the second source resistor RD2, passing also in the first PMOS transistor M4 of the second current mirror M4, M6, MB4, are mirrored by the second PMOS transistor M5 of the first output branch M5, MB3 of the first current mirror M3, M5, MB3 and by the second PMOS transistor M6 of the second output branch M6, MB4, respectively.

In addition, it should be noted that a further current scaling can be obtained using a determined ratio (for example, 5:1) between the first PMOS transistor M3 of the first current mirror M3, M5, MB3 and the second PMOS transistor M5 of the first output branch M5, MB3 and the same ratio between the first PMOS transistor M4 of the second current mirror M4, M6, MB4 and the second PMOS transistor M6 of the second output branch M6, MB4, wherein the respective transistors are DC biased with the respective current generator MB3 and MB4, having the respective third bias voltage VB2.

The current signal present in the second PMOS transistor M5 of the first output branch M5, MB3 and the current signal present in the PMOS transistor M4 of the second output branch M6, MB4, flow out from the first output terminal OUT1 and the second output terminal OUT2, respectively, representing the differential signal to be provided to the first input differential terminal c1 and the second input differential signal c2 of the AD converter 105 of the driving module 106 (FIG. 1).

It should be noted that most of the audio AD converter used for audio in portable equipments, such as mobile phones, are compliant with the current signal provided by the differential stage 300 without needing a current to voltage analog converter. In any case, such option can be easily inserted in the circuit, if necessary.

From a noise point of view, the circuit diagram of the differential stage of FIG. 3 (and of FIG. 4) is intrinsically low noise because few MOS transistors, which can be easily optimized, are used. The dominant noise sources are the first source resistor RD1 and the second source resistor RD2, the first input NMOS transistor M1 and the second input NMOS transistor M2 and the PMOS transistors M5 and M6 present in the first output branch M5, MB3 and the second output branch M6, MB4, respectively. The noise of the first current generator MB1 and the second current generator MB2 can be made much lower than that of the first input NMOS transistor M1 and the second input NMOS transistor M2, by proper sizing, in the same way as it is usually done in standard differential amplifiers. The contribution of the first PMOS transistor M3 of the current mirror M3, M5, MB3 and the first PMOS transistor M4 of the second current mirror M4, M6, MB4 is negligible since their noise is divided by the AC gain between VIP/VIN and their respective gate terminals.

The circuit for use with a loudspeaker for portable equipments of the invention results more precise and reliable then the architecture of the prior art and particularly advantageously creates a replica of the current passing into the loudspeaker which substantially corresponds to the current passing in the loudspeaker.

Real time impedance detection of a loudspeaker can be obtained thanks to the current copier that monitors the current signal flowing into the loudspeaker in order to measure the impedance with an AD converter and a digital processor unit of driving module.

In this way, excessive current peaks can be equalized avoiding any damage even if the power is increased to a level never used before, without damage. Also the audio quality is improved with this peaking equalization.

The invention claimed is:

1. A circuit for use with a loudspeaker having a first differential input terminal and a second differential input terminal, the circuit comprising:
a differential power amplifier having a first differential output terminal operatively connected to the first differential input terminal of the loudspeaker and a second differential output terminal operatively connected to the second differential input terminal of the loudspeaker;
a first resistor disposed between the first differential output terminal of the differential power amplifier and the first differential input terminal of the loudspeaker;
a second resistor disposed between the second differential output terminal of the differential power amplifier and the second differential input terminal of the loudspeaker, the circuit wherein it further comprises:
a first resistive module arranged to generate on a respective output terminal a first control voltage, the first resistive module having a first input terminal connected to the first differential output terminal of the power amplifier and a second input terminal connected to the second differential input terminal of the loudspeaker,
a second resistive module arranged to generate on a respective output terminal a second control voltage, the second resistive module having a first input terminal connected to the second differential output terminal of the power amplifier and a second input terminal connected to the first differential input terminal of the loudspeaker,
the circuit being arranged to control the differential power amplifier on the basis of the first control voltage and the second control voltage.

2. The circuit of claim 1, wherein the first resistive module comprises a third resistor and a fourth resistor, the third resistor having a respective first terminal corresponding to the first input terminal of the first resistive module and a respective second terminal, the fourth resistor having a respective first terminal corresponding to the second input terminal of the first resistive module and a respective second terminal, the second terminal of the third resistor and the second terminal of the fourth resistor being connected together in a node, the output terminal of the first resistive module being connected to said node.

3. The circuit of claim 1, wherein the second resistive module comprises a fifth resistor and a sixth resistor, the fifth resistor having a respective first terminal corresponding to the first input terminal of the second resistive module and a respective second terminal, the sixth resistor having a respective first terminal corresponding to the second input terminal of the second resistive module and a respective second terminal, the second terminal of the fifth resistor and the second terminal of the sixth resistor being connected together in a node, the output terminal of the second resistive module being connected to said node.

4. The circuit of claim 3, wherein the third resistor of the first resistive module, the fourth resistor of the first resistive module, the fifth resistor of the second resistive module and the sixth resistor of the second resistive module have substantially a same first reference value.

5. The circuit of claim 4, wherein said second reference value is lower than the first reference value.

6. The circuit of claim 1, wherein the first resistor and the second resistor have substantially a same second reference value.

7. The circuit of claim 1, further comprising a differential stage having a first differential input terminal to receive the first control voltage and a second differential input terminal to receive the second control voltage, the differential stage having a first differential output terminal and a second differential output terminal.

8. The circuit of claim 7, wherein the differential stage comprises:
a first input NMOS transistor having the gate terminal corresponding to the first differential input terminal of the differential stage, the drain terminal operatively connected to a first reference voltage through a first current generator and the source terminal operatively connected to a second supply voltage through a first source resistor of the differential stage and a second current generator;
a second input NMOS transistor having the gate terminal corresponding to the second differential input terminal of the differential stage, the drain terminal operatively connected to the first reference voltage through a third current generator and the source terminal operatively connected to the second reference voltage through a second source resistor of the differential stage and the second current generator.

9. The circuit of claim 8, wherein:
each of the NMOS transistors and each of the PMOS transistors representing the current generators of the differential stage, is electrically connected in series with a respective NMOS transistor and with a PMOS transistor, in a cascode configuration,
each of the PMOS transistor of the first current mirror is electrically connected in series with a respective PMOS transistor in a cascode configuration and each of the PMOS transistor of the second current mirror is electrically connected in series with a respective PMOS transistor in a cascode configuration.

10. The circuit of claim 8, wherein the differential stage further comprises:
a first current mirror arranged to mirror the current passing on the first source resistor of the differential stage to a first output branch connected to the first differential output terminal of the differential stage;
a second current mirror arranged to mirror the current passing on the second source resistor of the differential stage to a second output branch connected to the second differential output terminal of the differential stage.

11. The circuit of claim 10, wherein:

the first current mirror comprises a first PMOS transistor having the gate terminal connected to the drain terminal of the first input NMOS transistor of the differential stage, the source terminal connected to the first reference voltage and the drain terminal connected to the source terminal of the first input NMOS transistor of the differential stage, and the first output branch comprising a second PMOS transistor having the gate terminal connected to the drain terminal of the first input NMOS transistor of the differential stage, the source terminal connected to the first reference voltage and the drain terminal connected to the second reference voltage through a respective current generator, the first differential output terminal of the differential stage corresponding to the drain terminal of the second PMOS transistor of the first output branch.

12. The circuit of claim 10, wherein:

the second current mirror comprises a first PMOS transistor having the gate terminal connected to the drain terminal of the second input NMOS transistor of the differential stage, the source terminal connected to the first reference voltage and the drain terminal connected to the source terminal of the second input NMOS transistor of the differential stage, and the second output branch comprises a second PMOS transistor having the gate terminal connected to the drain terminal of the second input NMOS transistor of the differential stage, the source terminal connected to the first reference voltage and the drain terminal connected to the second reference voltage through a respective current generator, the second differential output terminal of the differential stage corresponding to the drain terminal of the second PMOS transistor of the second output branch.

13. The circuit according to claim 1, further comprising a driving module having a first differential input terminal operatively connected with the first differential output terminal of the differential stage and a second differential input terminal operatively connected to the second differential output terminal of the differential stage, said driving circuit having a first differential output terminal operatively connected to a first differential input terminal of the differential power amplifier and a second differential output terminal operatively connected to a second differential input terminal of the differential power amplifier.

14. The circuit of claim 13, wherein the driving module comprises:

a digital processing unit;
a digital-to-analog converter; and
a analog-to-digital converter.

15. Portable equipment comprising a loudspeaker and a circuit according to claim 1.

* * * * *